United States Patent [19]
Lee

[11] Patent Number: 5,885,886
[45] Date of Patent: Mar. 23, 1999

[54] METHOD FOR MANUFACTURING SEMICONDUCTOR DEVICE

[75] Inventor: Sang Don Lee, Chungcheongbuk-do, Rep. of Korea

[73] Assignee: LG Semicon Co., Ltd., Chungcheongbuk-do, Rep. of Korea

[21] Appl. No.: 932,830

[22] Filed: Sep. 18, 1997

[30] Foreign Application Priority Data

Dec. 26, 1996 [KR] Rep. of Korea ............... 1996 72196

[51] Int. Cl.⁶ .................................................. H01L 21/425
[52] U.S. Cl. ...................... 438/528; 438/305; 438/407; 438/520
[58] Field of Search ................. 438/247, 252, 438/289, 302, 407, 440, 520, 525, 528, 571, 305, 306

[56] References Cited

U.S. PATENT DOCUMENTS

| | | | |
|---|---|---|---|
| 4,683,645 | 8/1987 | Naguib et al. | 438/306 |
| 4,689,667 | 8/1987 | Aronowitz | 438/528 |
| 4,837,173 | 6/1989 | Alvis et al. | 438/528 |
| 4,916,507 | 4/1990 | Boudou et al. | 438/528 |
| 5,217,910 | 6/1993 | Shimizu et al. | 438/302 |
| 5,266,510 | 11/1993 | Lee | 438/528 |
| 5,360,749 | 11/1994 | Anjum et al. | 438/302 |
| 5,426,063 | 6/1995 | Kaneko et al. | 438/302 |
| 5,459,089 | 10/1995 | Baliga | 438/571 |
| 5,468,974 | 11/1995 | Aronowitz et al. | 438/528 |
| 5,585,286 | 12/1996 | Aronowitz et al. | 438/306 |
| 5,635,412 | 6/1997 | Baliga et al. | 438/520 |

OTHER PUBLICATIONS

Wolf et al., Silicon Processing for the VLSI Era vol. 1, pp. 325–327, 1986.

*Primary Examiner*—Charles Bowers
*Assistant Examiner*—Jack Chen

[57] ABSTRACT

A method for manufacturing a semiconductor device exhibiting improved short channel effects and increased current driving ability is disclosed. The method includes the steps of: providing a substrate of a first conductivity-type, e.g., P-type; forming a gate insulating layer on the substrate; forming a gate electrode on the gate insulating layer; forming a gate cap insulating layer on the gate electrode; introducing inactive ions of the first conductivity-type into the first conductivity-type semiconductor substrate at both sides of the gate electrode, so as to form amorphous regions; forming first impurity regions of the first conductivity-type near the amorphous regions; and forming second impurity regions of a second conductivity-type, e.g., N-type, in the substrate at both sides of the gate electrode. The method also includes forming source and drain regions of the second conductivity-type in the substrate. The amorphous regions are formed by ion implantation of the inactive ions while the first and second impurity regions and the source and drain regions are formed by ion implantation of active ions. Inactive ions are ions which, after implantation into the amorphous regions, assume an atomic or molecular state in which they act neither as acceptors nor donors. Conversely, active ions act as acceptors or donors after implantation.

30 Claims, 4 Drawing Sheets

METHOD FOR MANUFACTURING SEMICONDUCTOR DEVICE

FIELD OF THE INVENTION

The present invention relates to a method for manufacturing a semiconductor device exhibiting improved short channel effects and increased current driving ability.

BACKGROUND OF THE INVENTION

A conventional method for manufacturing a semiconductor device will be discussed with reference to the attached drawings.

FIGS. 1a to 1d are cross-sectional views showing a conventional method for manufacturing a semiconductor device.

As shown in FIG. 1a, active regions and field regions are defined on a P-type semiconductor substrate 1. A field oxide layer 2 is formed on the field regions. Subsequently, a first oxide layer, a polysilicon layer and a second oxide layer are successively formed on the entire surface. Utilizing a mask, the first oxide layer, the polysilicon layer, and the second oxide layer are patterned to form a gate oxide layer 3, a gate electrode 4, and a gate cap insulating layer 5. P-type impurity ions are implanted at a tilt angle of 7°–20° into the semiconductor substrate 1 at both sides of the gate electrode 4, thus forming first halo regions 6.

Referring to FIG. 1b, P-type impurity ions are implanted at a tilt angle of 30°–60° into the substrate 1 at both sides of the gate electrode 4, so as to form second halo regions 7. In this case, the second halo regions 7 extend further underneath the gate electrode 4 than the first halo regions 6, and have a more shallow depth than the first halo regions 6.

Referring to FIG. 1c, lightly-doped N-type impurity ions are implanted into the semiconductor substrate 1 at both sides of the gate electrode 4, thus forming a lightly doped drain (LDD) regions 8.

Referring to FIG. 1d, utilizing a chemical vapor deposition (CVD) method, an oxide layer is formed on the entire surface and then subjected to etch-back, thus forming insulating sidewalls 9 on the both sides of the gate electrode 4. With the gate electrode 4 and the gate insulating sidewalls 9 serving as masks, highly-doped N-type impurity ions are implanted into the semiconductor substrate 1. This produces source and drain regions 10 in the P-type conductivity-type substrate 1 on both sides of the insulating sidewalls 9. In this case, the depth of the first halo regions 6 is similar to that of the source and drain regions 10, and the depth of the second halo regions 7 is similar to that of the LDD regions 8, thereby improving short channel effects. Thus, the conventional manufacturing of a semiconductor device is completed.

Such a conventional method for manufacturing a semiconductor device has problems.

Ion implantation processes are performed twice to form the different halo regions. The halo regions 6 improve the breakdown voltage characteristics and the halo regions 7 improve short channel effects and adjust the threshold voltage. Consequently, the first and second halo regions overlap each other.

As channel lengths get shortened in highly integrated devices, increasingly high concentrations in the first halo region 6 are required to adjust a breakdown voltage. Consequently, the portions where the first and second halo regions overlap have an even higher doping concentration. As a result, it is hard to adjust threshold voltage using the portions having an overlap-increased, high doping concentration, which causes difficulties in carrying out a successful ion implantation process.

SUMMARY OF THE INVENTION

Therefore, the present invention is directed to a manufacturing method of a semiconductor device that substantially obviates one or more of problems due to limitations and disadvantages of the related art.

An object of the invention is to provide a method for manufacturing a semiconductor device exhibiting improved short channel effects, an increased breakdown voltage and improved current driving ability.

To achieve these and other advantages and in accordance with the purpose of the present invention, as embodied and broadly described, a method for manufacturing a semiconductor device is provided and includes the steps of: providing a substrate of a first conductivity-type, e.g., P-type; forming a gate insulating layer on the substrate; forming a gate electrode on the gate insulating layer; forming a gate cap insulating layer on the gate electrode; introducing inactive ions into the first conductivity-type semiconductor substrate at both sides of the gate electrode, so as to form amorphous regions; forming first impurity regions of the first conductivity-type near the amorphous regions; and forming second impurity regions of a second conductivity-type, e.g., N-type, in the substrate at both sides of the gate electrode. The method also includes forming source and drain regions of the second conductivity-type in the substrate.

The amorphous regions of the present invention are formed by ion implantation of the inactive ions while the first and second impurity regions and the source and drain regions are formed by ion implantation of active ions. Inactive ions are ions which, after implantation into the first conductivity-type substrate, assume an atomic or molecular state in which they act neither as acceptors nor donors. Conversely, active ions act as acceptors or donors after implantation.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings. It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, which depict exemplary embodiments and do not limit the claims, and in which:

DETAILED DESCRIPTION OF THE PREFERRED EMBODIMENTS

Reference will now be made in detail to the preferred embodiments of the present invention, examples of which are illustrated in the accompanying drawings.

Referring to FIGS. 2a to 2e, there is provided a manufacturing method of a semiconductor device.

Figure 1A:
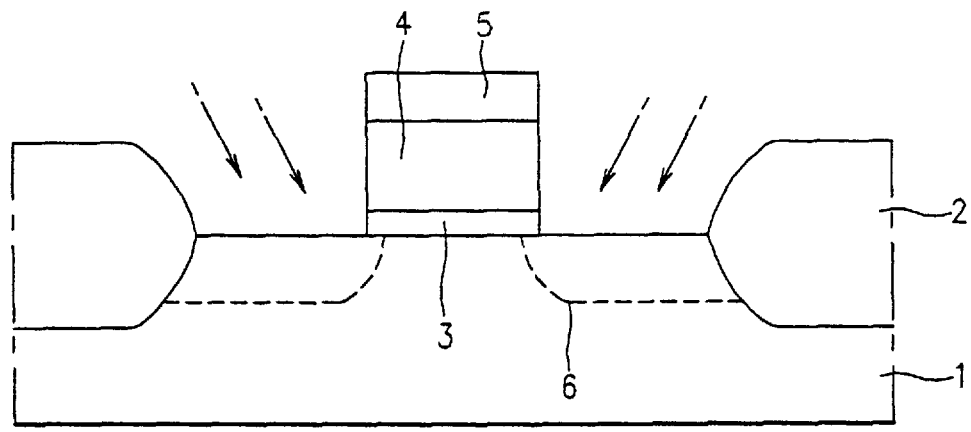
FIGS. 1a to 1d are cross-sectional views showing a conventional method for manufacturing a semiconductor device.
Figure 1B:
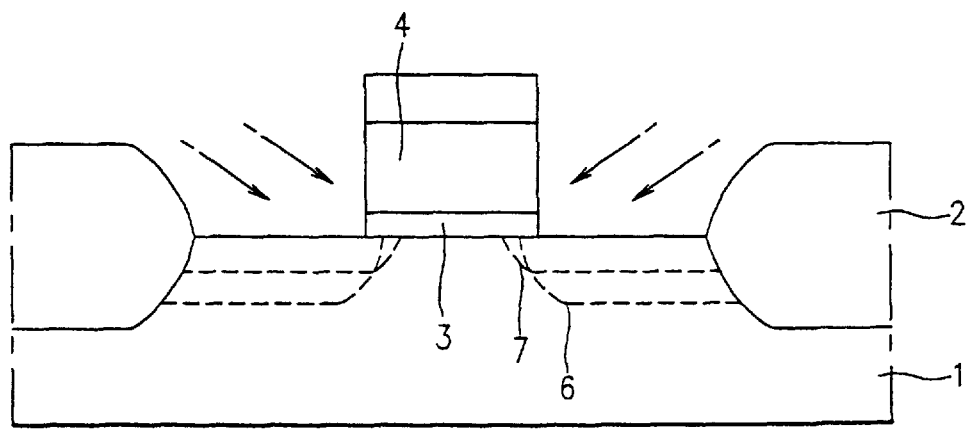
Figure 1C:
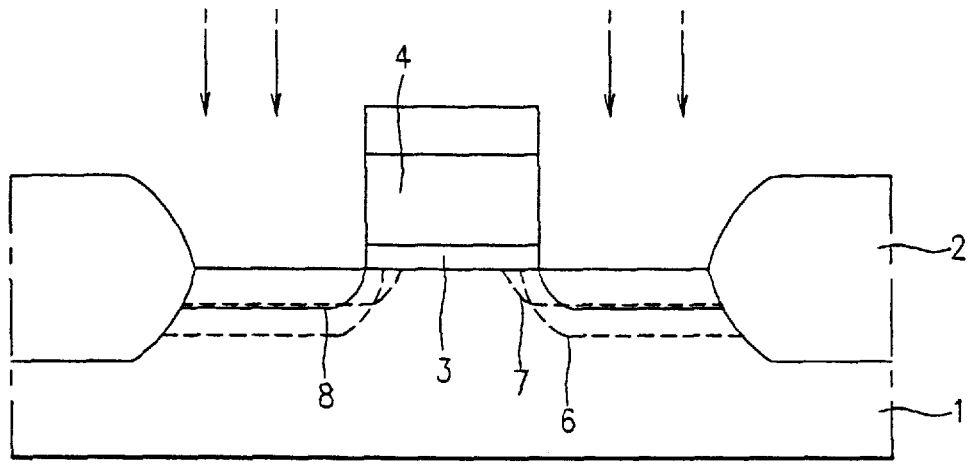
Figure 1D:
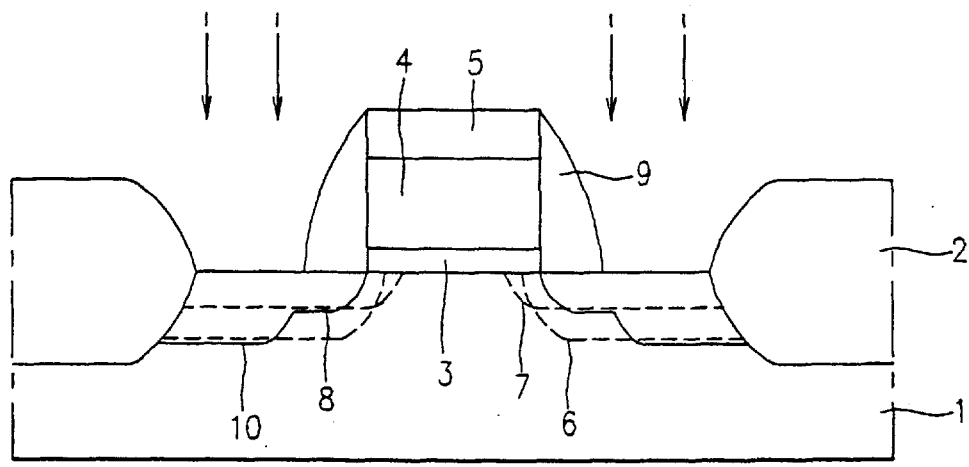
Figure 2A:
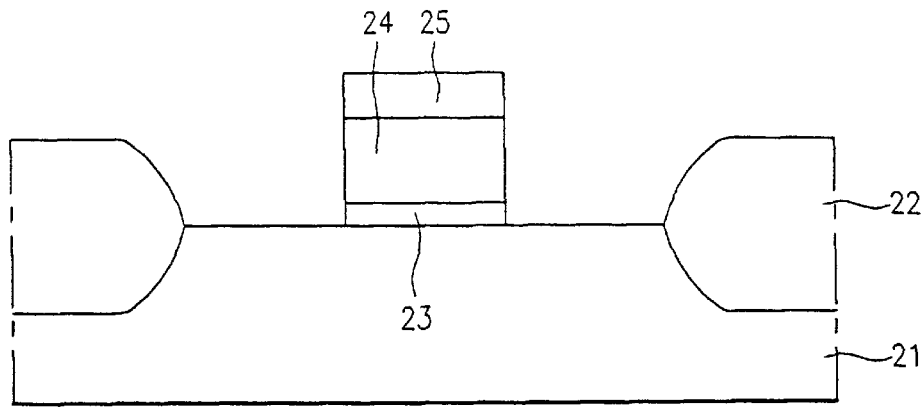
FIGS. 2a to 2e are cross-sectional views showing a method for manufacturing a semiconductor device according to a preferred embodiment of the invention.

Referring to FIG. 2a, field regions and active regions are defined on a semiconductor substrate 21, e.g., P-type monocrystalline silicon. Then a field oxide layer 22 is formed on the field regions.

Subsequently, a first oxide layer, a conductive (e.g., polysilicon) layer, and an insulating layer are successively formed. The insulating layer is an oxide layer, a nitride layer, a doped oxide layer, or double layers of an oxide and a nitride. Utilizing a mask, the first oxide layer, the polysilicon layer, and the insulating layer are patterned to form a gate insulating (e.g., oxide) layer 23, a gate electrode 24, and a gate cap insulating layer 25.

Figure 2B:
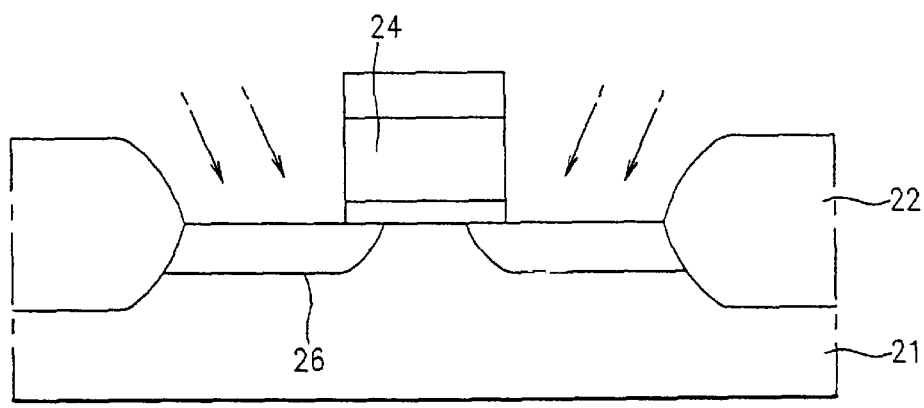

Referring to FIG. 2b, using the gate electrode 24 as a mask, one or more of the following inactive ions, such as germanium ions, silicon ions, nitrogen ions, fluorine ions, and argon ions are implanted at a tilt angle into the substrate 21.

The ions are inactive in the sense that they assume an atomic or molecular states that do not act as either donors or as acceptors in the lattice.

In the exemplary embodiments, the ions extend a predetermined distance under the gate electrode 24. Portions of the monocrystalline silicon substrate 21 become amorphous silicon regions 26. In this exemplary embodiment, the tilt angle is 0°–60°, the ion implantation energy is 5–500 KeV and the dosage of the impurity ions is $1 \times 10^{12}$ ions/cm$^2$–$1 \times 10^{16}$ ions/cm$^2$.

Figure 2C:
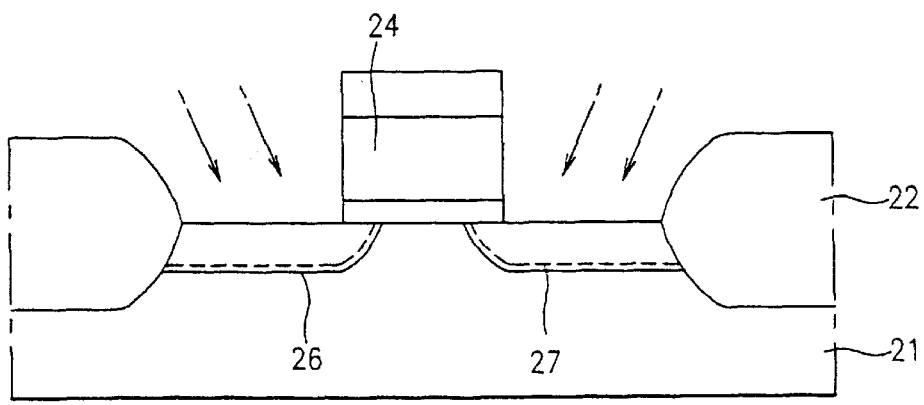

Referring to FIG. 2c, with the gate electrode 24 serving as a mask, P-type active ions are implanted at a tilt angle of 0°–60° into the substrate 21, thus forming halo regions 27. The ions are active in the sense that, after they are implanted, the act as either acceptors or donors.

The amorphous silicon regions 26 act as a gathering center where ions (that alter the substrate 21 to form the halo regions 27) accumulate. Also, the amorphous silicon regions 26 serve to prevent ions from diffusing as rapidly during annealing as would be the case if the region 26 were monocrystalline silicon. The doping concentration of the halo regions 27 is increased, e.g., by a factor or about 1.2 or 1.3, due to the previous formation of the amorphous silicon regions 26.

Figure 2D:
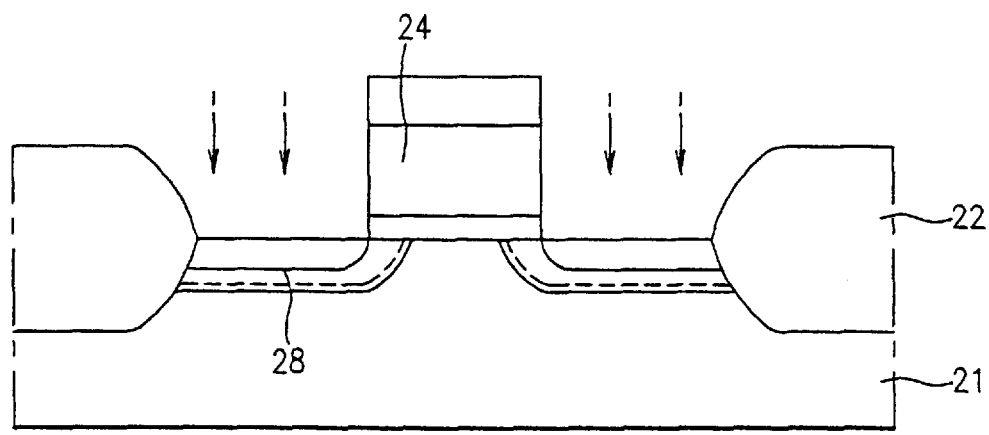

Referring to FIG. 2d, with the gate electrode 24 serving as a mask, lightly doped N-type ions are implanted into the exposed semiconductor substrate 21 at both sides of the gate electrode 24, thus forming lightly doped drain (LDD) regions 28.

Figure 2E:
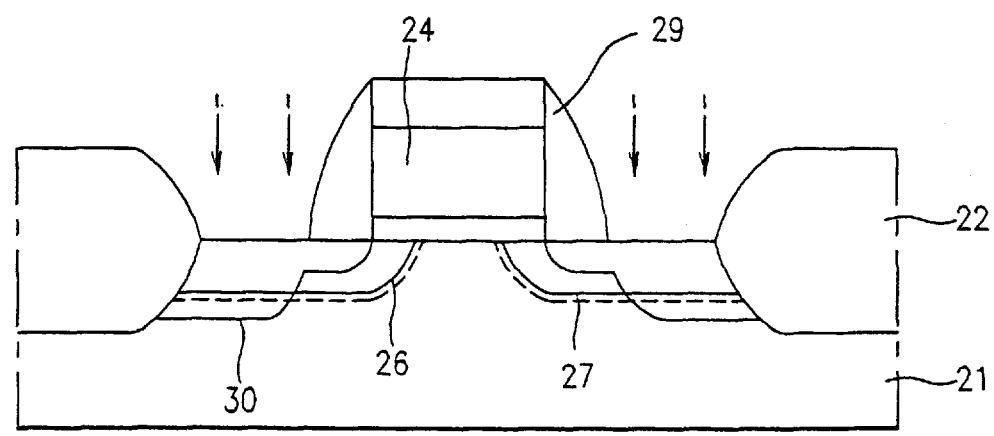

Referring to FIG. 2e, an insulating layer is formed, e.g., by a chemical vapor deposition (CVD) method and then is subjected to an etch-back process, thereby forming insulating sidewalls against both sides of the gate electrode 24. Next, with the gate electrode 24 and the insulating sidewalls 29 serving as masks, highly doped N-type ions are implanted into the P-type semiconductor substrate 21, thus forming the source and drain regions 30.

Thereafter, the implanted ions are activated by annealing, which causes the halo regions to expand. This expansion is indicated in FIG. 2e by the dashed line 27 being depicted outside of the amorphous region indicated by the line 26. This is in contrast to FIGS. 2c–2d, where the dashed line 27 is depicted inside the line 26.

Then, an interlayer insulating layer is formed, a contact pattern is formed, and a wiring process is performed. This completes the semiconductor device of the invention.

The exemplary embodiments of the present invention can be applied, e.g., to MOS devices and to diodes of different conductivity-types. To explain how to apply the invention to them, one or more ions such as argon ions, germanium ions, silicon ions, fluorine ions, and nitrogen ions (which will be subsequently be inactive, neither acting as acceptors nor as donors) are implanted into a P-type conductivity monocrystalline silicon substrate, thus forming amorphous silicon regions. An ion implantation energy of 5–500 KeV and a dosage of $1 \times 10^{12}$ ions/cm$^2$–$1 \times 10^{16}$ ions/cm$^2$ is used to form the amorphous regions. Then, the P-type ions are implanted at a tilt angle of 0°–60° to form the halo regions. These halo regions are formed near the amorphous regions. The amorphous regions act as ion-gathering centers where ions gather for the formation of the halo regions.

Subsequently, there are formed N-type impurity regions which have a junction with the P-type impurity regions in the halo regions of the substrate. As a result, an N+/P junction is achieved, thereby enabling the characteristics of reverse breakdown voltage, leakage current and forward current to be adjusted.

Alternatively, the substrate can be monocrystalline N-type silicon, the first ion-implantations can use inactive ions, the second ion-implantations can use N-type impurity ions to form the halo regions, the third ion-implantation can use lightly doped P-type impurity ions to form the LDD regions, and the fourth ion-implantation can use highly doped P-type impurity ions to form the source and drain regions.

The manufacturing method of a semiconductor device of the invention has the following advantages.

First, amorphous silicon regions act as gathering centers of impurity ions used in the subsequent formation of halo regions. As a result, impurity ions of the halo regions cannot be diffused as rapidly as in a monocrystalline silicon substrate, thereby maintaining a high concentration of impurity ions at the halo regions. Therefore, it is possible to produce a semiconductor device exhibiting improved breakdown voltage characteristics.

Second, since the impurity ions implanted into the semiconductor substrate are diffused only slightly into the channel regions, reverse short channel effects are improved and a threshold voltage is easily adjusted.

Third, since doping concentrations can be kept low in all regions except the halo regions, current driving ability is improved.

It will be apparent to those skilled in the art that various modifications and variations can be made in the manufacturing method of a semiconductor device of the present invention without departing from the spirit or scope of the inventions. Thus, it is intended that the present invention cover the modifications and variations of this invention as would be obvious to one of ordinary skill in the art and that these modifications and variations be included within the scope of the appended claims and their equivalents.

What is claimed is:

1. A method for manufacturing a semiconductor device, the method comprising the steps of:

providing a first conductivity-type substrate;

introducing inactive ions into said substrate, so as to form amorphous regions;

forming first impurity regions of said first-conductivity-type within said amorphous regions;

forming second impurity regions of a second conductivity-type in said amorphous regions of said substrate; and annealing said substrate such that said first impurity regions are expanded in said substrate beyond said amorphous regions.

2. The method as claimed in claim 1, wherein said inactive ions are ions which, after implantation into said amorphous regions, act neither as acceptors nor as donors.

3. The method as claimed in claim 1, wherein said step of introducing includes using one or more of argon ions, germanium ions, silicon ions, fluorine ions, and nitrogen ions as said inactive ions.

4. The method as in claim 1, wherein said step of providing said substrate includes using monocrystalline silicon as material for said substrate and said step of introducing includes ion implanting said inactive ions to form amorphous silicon regions.

5. The method as claimed in claim 4, wherein said step of ion implanting said inactive ions includes using an ion implantation energy of 5–500 KeV and a dosage of $1\times10^{12}$ ions/cm$^2$–$1\times10^{16}$ ions/cm$^2$.

6. The method as claimed in claim 4, wherein said step of ion implanting includes using two or more kinds of inactive ions and aiming said inactive ions at different tilt angles.

7. The method as in claim 1, further comprising:
    forming source and drain regions of said second conductivity-type in said substrate.

8. The method as in claim 7, wherein said step of forming source and drain regions includes ion implanting highly doped second conductivity-type active ions into said substrate.

9. The method as in claim 1, wherein said first conductivity-type is P-type and said second conductivity-type is N-type.

10. The method as in claim 1, wherein said step of forming said first impurity regions includes ion implanting said first-conductivity-type active ions near said amorphous regions.

11. The method as in claim 10, wherein said step of forming second impurity regions includes ion implanting second conductivity-type active ions into said amorphous regions.

12. The method as claimed in claim 11, wherein said inactive ions are implanted at a tilt angle of 0°–60°, and active ions to form said first impurity regions are implanted at a tilt angle of 0°–60°.

13. The method as in claim 11, wherein said first conductivity-type is P-type and said second conductivity-type is N-type.

14. The method as in claim 1, wherein said step of forming second impurity regions includes ion implanting second conductivity-type active ions into said amorphous regions.

15. A method for manufacturing a semiconductor device, the method comprising the steps of:
    providing a substrate of a first conductivity-type;
    forming a gate insulating layer on said substrate;
    forming a gate electrode on said gate insulating layer;
    forming a gate cap insulating layer on said gate electrode;
    introducing inactive ions into said first conductivity-type semiconductor substrate at both sides of said gate electrode, so as to form amorphous regions;
    forming first impurity regions of said first conductivity-type within said amorphous regions;
    forming second impurity regions of a second conductivity-type in said substrate at said both sides of said gate electrode; and annealing said substrate such that said first impurity regions are expanded in said substrate beyond said amorphous regions.

16. The method as claimed in claim 15, wherein inactive ions are ions which, after implantation into said first conductivity-type substrate, act neither as acceptors nor as donors.

17. The method as claimed in claim 15, wherein said step of introducing includes using one or more of argon ions, germanium ions, silicon ions, fluorine ions, and nitrogen ions as said inactive ions.

18. The method as claimed in claim 17, wherein said step of introducing includes ion implanting two or more kinds of inactive ions and aiming said inactive ions at the same angle.

19. The method as claimed in claim 17, wherein said step of introducing includes ion implanting two or more kinds of inactive ions and aiming said inactive ions at different tilt angles.

20. The method as claimed in claim 15, wherein said step of introducing includes ion implanting said inactive ions at a tilt angle of 0°–60°, and said step of forming said first impurity regions includes ion implanting active ions at a tilt angle of 0°–60°.

21. The method as in claim 20, wherein said step of forming second impurity regions includes ion implanting second conductivity-type active ions into said amorphous regions.

22. The method as claimed in claim 15, wherein said step of introducing includes ion implanting said inactive ions at an energy of 5–500 KeV and a dosage of $1\times10^{12}$ ions/cm$^2$–$1\times10^{16}$ ions/cm$^2$.

23. The method as in claim 15, wherein said step of providing a substrate includes using monocrystalline silicon as material for said substrate and said step of introducing includes ion implanting said inactive ions to form amorphous silicon regions.

24. The method as claimed in claim 23, wherein said step of ion implanting includes using two or more kinds of inactive ions and aiming said inactive ions at different tilt angles.

25. The method as in claim 15, further comprising:
    forming source and drain regions of said second conductivity-type in said substrate.

26. The method as in claim 25, wherein said step of forming source and drain regions includes ion implanting highly doped second conductivity-type active ions into said substrate.

27. The method as in claim 15, wherein said first conductivity-type is P-type and said second conductivity-type is N-type.

28. The method as in claim 15, wherein said step of forming said first impurity regions includes ion implanting said first-conductivity-type active ions near said amorphous regions.

29. The method as in claim 28, wherein said step of forming second impurity regions includes ion implanting second conductivity-type active ions into said amorphous regions.

30. The method as in claim 29, wherein said first conductivity-type is P-type and said second conductivity-type is N-type.

* * * * *